(12) United States Patent
van Gastel et al.

(10) Patent No.: US 9,605,939 B2
(45) Date of Patent: Mar. 28, 2017

(54) CAPACITIVE SENSOR ARRAY AND METHOD FOR DETECTING ACTUATION GESTURES AT A MOTOR VEHICLE

(75) Inventors: Peter van Gastel, Solingen (DE); Bernd Gerdes, Essen (DE)

(73) Assignee: Huf Huelsbeck & Fuerst GmbH & Co. KG, Velbert (DE)

( * ) Notice: Subject to any disclaimer, the term of this patent is extended or adjusted under 35 U.S.C. 154(b) by 367 days.

(21) Appl. No.: 14/128,393

(22) PCT Filed: Jun. 21, 2012

(86) PCT No.: PCT/EP2012/061921
§ 371 (c)(1),
(2), (4) Date: Apr. 30, 2014

(87) PCT Pub. No.: WO2013/000805
PCT Pub. Date: Jan. 3, 2013

(65) Prior Publication Data
US 2014/0285217 A1    Sep. 25, 2014

(30) Foreign Application Priority Data

Jun. 29, 2011 (DE) .................. 10 2011 051 434

(51) Int. Cl.
*G01R 27/26* (2006.01)
*G01B 7/00* (2006.01)
(Continued)

(52) U.S. Cl.
CPC .......... *G01B 7/003* (2013.01); *B60R 25/2054* (2013.01); *G01R 27/2605* (2013.01);
(Continued)

(58) Field of Classification Search
CPC ......... H03K 17/945; G01B 7/00; G01R 27/26
(Continued)

(56) References Cited

U.S. PATENT DOCUMENTS 5,294,292 A    3/1994  Yamashita et al.
5,394,292 A    2/1995  Hayashida
(Continued)

FOREIGN PATENT DOCUMENTS

DE       19681725 B4    4/2007
DE    102009025212 A1    4/2010
(Continued)

OTHER PUBLICATIONS

International Search Report of International Application No. PCT/EP2012/061921 dated Oct. 5, 2012.
(Continued)

*Primary Examiner* — Son Le
*Assistant Examiner* — Alvaro Fortich
(74) *Attorney, Agent, or Firm* — Fay Sharpe LLP

(57) ABSTRACT

A sensor array for detecting the approach and movement gestures of a user at a motor vehicle includes a capacitive sensor array and at least one control device that is coupled to the sensor array and detects a change in the capacitance of the sensor array. The sensor array includes at least two sensor electrode arrays which are arranged at spatially offset positions on the motor vehicle. The sensor electrodes are configured as elongate electrode arrays and are arranged with the same spatial orientation. The control and evaluation device is designed for cyclical activation and evaluation of the sensor electrodes with changeable, electrode-specific, different cycle rates.

5 Claims, 3 Drawing Sheets

(51) Int. Cl.
*B60R 25/20* (2013.01)
*H03K 17/955* (2006.01)
*E05F 15/46* (2015.01)
*E05F 15/73* (2015.01)

(52) U.S. Cl.
CPC .......... *H03K 17/955* (2013.01); *E05F 15/46* (2015.01); *E05F 15/73* (2015.01); *E05Y 2400/852* (2013.01); *E05Y 2400/858* (2013.01); *E05Y 2900/50* (2013.01); *E05Y 2900/546* (2013.01); *H03K 2217/94042* (2013.01)

(58) Field of Classification Search
USPC .......................... 324/658–690; 345/173–178
See application file for complete search history.

(56) References Cited

U.S. PATENT DOCUMENTS

| | | | |
|---|---|---|---|
| 5,730,165 A | | 3/1998 | Philipp |
| 5,914,610 A | | 6/1999 | Gershenfeld et al. |
| 6,879,250 B2 | * | 4/2005 | Fayt ................ B60R 19/445 150/154 |
| 7,262,609 B2 | * | 8/2007 | Reynolds ................ G01D 5/24 324/678 |
| 7,952,366 B2 | | 5/2011 | Philipp et al. |
| 2007/0095675 A1 | * | 5/2007 | Krummen ............ G01N 33/004 205/464 |
| 2007/0288139 A1 | * | 12/2007 | Schillinger .............. G01H 1/00 701/1 |
| 2007/0291016 A1 | * | 12/2007 | Philipp ................ G01D 5/2405 345/174 |
| 2008/0122798 A1 | * | 5/2008 | Koshiyama ........... G06F 3/0412 345/173 |
| 2009/0039902 A1 | * | 2/2009 | Hargreaves ........ G01R 27/2605 324/686 |
| 2009/0065053 A1 | * | 3/2009 | Gulbinski ......... H01L 31/02242 136/256 |
| 2009/0159460 A1 | * | 6/2009 | Du ........................ B01D 61/44 205/743 |
| 2010/0271047 A1 | | 10/2010 | Soerensen et al. |
| 2011/0001549 A1 | * | 1/2011 | Van Gastel .......... H03K 17/955 327/517 |
| 2011/0221459 A1 | * | 9/2011 | Uno ....................... B60N 2/002 324/713 |
| 2011/0276234 A1 | | 11/2011 | Van Gastel |

FOREIGN PATENT DOCUMENTS

| | | |
|---|---|---|
| DE | 102008063366 | 7/2010 |
| DE | 102010000271 A1 | 2/2011 |
| EP | 1978642 A2 | 10/2008 |
| EP | 1980450 A1 | 10/2008 |
| EP | 2098671 | 9/2009 |

OTHER PUBLICATIONS

International Preliminary Report on Patentability Corresponding to International Application No. PCT/EP2012/061921 filed Jun. 21, 2012.

* cited by examiner

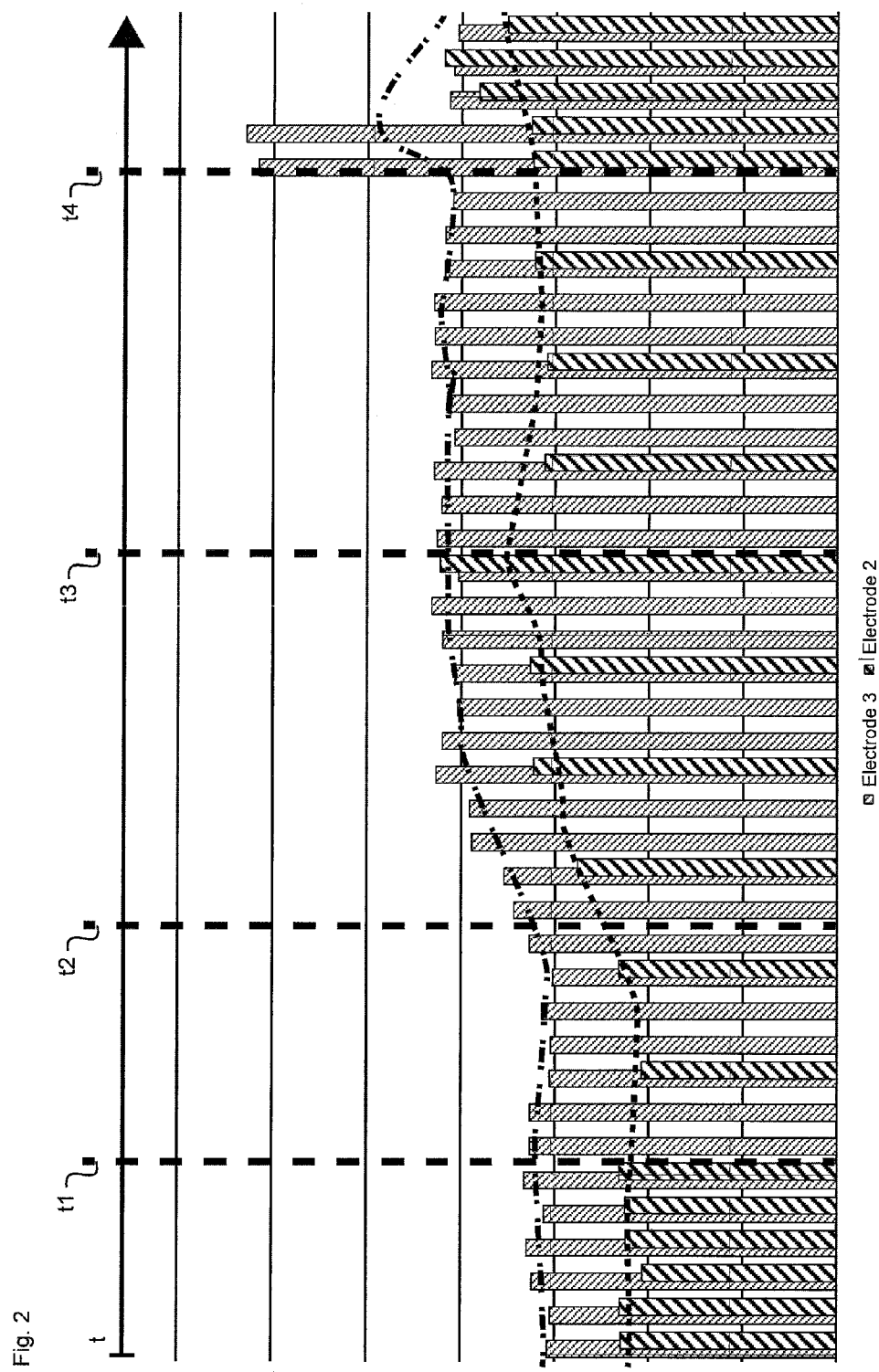

CAPACITIVE SENSOR ARRAY AND METHOD FOR DETECTING ACTUATION GESTURES AT A MOTOR VEHICLE

The invention relates to a capacitive sensor array for detecting the approach and movement gestures of a user at a motor vehicle, and an associated method.

A capacitive sensor array is coupled to a control device, which detects a change in the capacitance of the sensor array with respect to a reference potential. The sensor array comprises at least two sensor electrode arrays which are arranged at spatially offset positions on the motor vehicle, the sensor electrodes being configured as elongate electrode arrays and being arranged with the same spatial orientation and the control and evaluation device being designed for cyclical activation of the sensor electrodes at predetermined time intervals.

A capacitive sensor array of the type mentioned is known for example from the U.S. Pat. No. 5,730,165 or respectively the corresponding patent document DE 19681725 B4. DE 10 2010 000 271 also describes a corresponding array.

Sensor electrodes are frequently used in order to actuate a door of a motor vehicle, i.e. the tailgate. For this, sensor electrodes can be used, which detect the approach of a body part, e.g. a swinging movement of a leg under the bumper, and transmit in a command for opening or closing the tailgate to a control device in the motor vehicle. DE 10 2009 025 212 discloses an evaluation method for such arrangements, wherein there the closing device has a capacitive sensor with just two electrodes. This makes it possible to measure capacitances of the two electrodes with respect to one another. Thereby in particular no additional reference capacitance is required, against which capacitances of an electrode are measured. Inter alia, this is intended to reduce the energy consumption with respect to closing devices with more than two electrodes. A problem which also emerges from the above-mentioned publication consists in that the energy consumption is considerable for regular interrogation over a lengthy period of time and puts a strain on the on-board energy system.

It is an object of the invention to provide a reliable sensor system which reduces the energy consumption with the same accuracy of detection.

This problem is solved according to the invention by a capacitive sensor array having the features of claim 1 and a method having the features of claim 7.

The solution according to the invention requires at least two sensor electrode arrays at spatially offset positions on the motor vehicle. The control- and evaluation device is designed for cyclical activation of the sensor electrodes in predetermined time intervals.

The configuration or construction of the sensor electrodes is not significant for the invention. Each of the electrodes can be constructed in the manner of a wire, laminar or in the manner of a foil, wherein the wire or the foil forms the sensor electrode of the capacitance sensor. The sensor electrode can extend partially over a portion or over the entire width of a bumper of the motor vehicle. The sensor electrodes can be a component part of the bumper or can be glued therein on the inner side or fastened by fastening means. In addition, the sensor electrodes can already be processed in the injection moulding process for the production of the bumper. The capacitance sensors can have a spatial separation here within the bumper, so that the first capacitance sensor is situated rather in the vertical extent region of the bumper, whereas the second capacitance sensor is preferably placed in the lower region of the rear bumper.

An essential aspect of the invention is that the control- and evaluation device for controlling and evaluating the sensor electrodes is designed with changeable, electrode-specific cycle rates.

In contrast to existing devices, the interrogation frequencies of the sensor electrodes of the detection device are electrode-specific, i.e. are able to be determined and able to be changed individually for each of the electrodes or at least two electrode groups. One or more electrodes can therefore be interrogated with higher cycle time/frequency (e.g. every 30 ms) than other electrodes (e.g. every 90 ms) of the sensor array.

The reduction of the frequency of interrogation leads directly to a reduction of the energy requirement. As the cycle time is reduced, but the interrogation is not interrupted over lengthy time segments, a calibration of the electrodes can also be ensured at any time even with a small cycle frequency. This calibration, which is a provision in capacitive electrodes which improves the detection accuracy, allows for the circumstance that the external conditions (e.g. temperature, air humidity, precipitation etc.) around a motor vehicle change frequently. The interrogation with reduced frequency is accordingly to be selected according to the invention so that the changes in the external area occur in a greater period of time than the time span between two measurements of each of the electrodes. For this, however, measurement intervals of some tens of milliseconds up to several seconds are possible.

Each electrode, i.e. also the electrodes which are interrogated with reduced cycle time, deliver values on interrogation which are supplied to a chronological evaluation e.g. the formation of a sliding mean value (if applicable with chronological weighting) for the purpose of calibration. This mean value over the previous time period is subtracted on the examination of a signal e.g. as an offset. Thus, the sensitivity for a detection of an event which is to be detected is retained at all times. In such a case, a significant deviation from the sliding mean value is established.

The interrogation frequency of the electrodes according to the invention is, however, not only to be provided differently for different electrodes, but in addition is to be changeable in operation. An interrogation cycle time of individual electrodes is increased as a function of discretionary events/triggers, when a time-critical detection is to take place. In the absence of corresponding events, the cycle rate is reduced.

According to the invention, through the control device one electrode is operated and evaluated with a higher cycle time than the remaining electrodes, even if the other electrodes are operated with reduced frequency. If triggering occurs in this electrode, the other electrodes can be switched into an operation with higher cycle time. This electrode, which is to be designated as primary electrode or wake-up electrode, is therefore used as a trigger for the remaining electrodes, which are operated with reduced cycle time. If, on the other hand, on one or more electrodes no actuation is detected for a predetermined period of time, these electrodes can be switched into an operation with reduced frequency. Here, each electrode, e.g. as a function of its arrangement on the vehicle, can have different frequencies for the reduced operation (eco mode) and the awakened operation (alert mode).

The manner in which the evaluation of the sensor electrodes takes place is discretionary, the essential factor being that a change in the capacitance of the sensor electrodes is detected. This detection can take place by the control circuit periodically charging and discharging the sensor electrodes with a predetermined frequency and evaluating at least one parameter of a current- or voltage characteristic, dependent on the periodic charging and discharging of the first sensor electrode, for the detection of the capacitance change. It carries out the periodic charging and discharging for example by coupling the sensor electrode with the predetermined frequency periodically repeatedly with a predetermined potential, for example the operating voltage potential. The voltage characteristic can be, for example, the voltage characteristic at the connection of the first sensor electrode. The parameter can be, for example, a voltage which is measured over a charge-accumulating capacitor, or a particular number of periods of charging and discharging up to the exceeding of a switching threshold by a voltage measured at the first sensor electrode.

In the arrangement according to the invention and in the associated method, the possibility exists to use the sensor electrodes for the monitoring of different, if applicable overlapping spatial regions. For this, the sensor electrodes can be constructed similarly or else differently.

The sensor electrode arrays are arranged e.g. in a rear bumper, in order to monitor the region behind the bumper and beneath the bumper. The signal patterns of the first sensor electrode and of the further sensor electrode array are interrogated repeatedly (e.g. in reaction to the detection of an ID transmitter from a keyless entry system). A predetermined gesture of a user, e.g. a feinted kick under the bumper, is to lead to an opening- or closing process. For this, the signal sequences of the sensor electrodes are detected and compared with signal sequences which indicate a systematic actuation of the device.

From this presentation, it can be seen, however, that an uninterrupted and high-frequency interrogation of all detection spaces is not necessary. A detection of an actuation is namely only possible with the presence of consistent data of several electrodes, e.g. the appropriate signal sequence of different electrodes. A body part of an operator, e.g. the foot, is firstly discerned in a detection zone which is only associated with a sub-group of the electrodes. With continued movement, the foot arrives into other or further detection zones. Through the invention, a group of the electrodes with higher frequency can be interrogated. If a possible actuation is registered in these electrodes, the other electrodes, which are in energy-reduced mode, are awakened and their interrogation frequency is increased. The energy requirement of the latter electrodes is thus reduced to degree which on the one hand enables a saving of energy and on the other hand (in contrast to switching off) ensures the calibration of these electrodes at all times. Which of the electrodes are operated with higher frequency than the remaining electrodes is to be determined as a function of the arrangement of the electrodes on the vehicle and the desired detection. One electrode can act as high-frequency wake-up electrode, which would have to detect first of all an approaching user, but this leads possibly to a frequent mis-awakening, when an approaching person does not intend any operation at all (pedestrians walking past). On the other hand, a sensor electrode can be clocked as wake-up electrode, which monitors a less accessible zone, e.g. beneath the vehicle. This reduces the quantity of mis-activation or high cycle time of the remaining electrodes, but can lead to delays or even to actuations being missed. The desired behaviour pattern can, however, be able to be set for a user or for maintenance personnel via an on-board system. If, for example, maximum energy saving is desired, the electrode array is switched after a predetermined period of time (e.g. after a few hours) into economy operation, wherein then only one of the electrodes operates in alert or high-frequency mode.

The other electrodes are clocked more slowly by up to several orders of magnitude, e.g. by a factor of 3, 10 or 50. If such a vehicle is parked for several days in one location (e.g. an airport), a considerable reduction in energy requirement is possible. All electrodes remain calibrated at all times, however, also at lower frequency. A returning user must, however, carry out a movement gesture twice, if necessary, because the cycle-reduced electrodes do not permit any time-resolved detection with sufficient resolution. However, the wake-up electrode detects the first gesture and brings the other electrodes into an alert state, so that the second movement gesture can be detected in proper form. When the alerting process takes place quickly enough, the first actuation process can also already be detected.

The device according to the invention enables various types of evaluation, on the one hand via the signal strength of both electrodes and on the other hand via the signal sequence. In particular, monitoring can be carried out as to which electrode responds first to a status change. A differentiation can be carried out via the known spatial arrangement of the electrodes.

In a preferred embodiment of the invention, the control- and evaluation device alters the cycle rate of the control and evaluation of individual electrodes as a function of the results of the evaluation on other electrodes.

Making the cycle change of individual electrodes dependent on the detection at other electrodes permits an improved energy efficiency. As described above, a permanently high-clocked wake-up electrode can be drawn upon as criterion for the cycle time of the other electrodes. These other electrodes are then reduced in their cycle rate independently of their detection. Therefore, not only are signal-free electrodes reduced in their cycle frequency, but also electrodes can be set into an economy mode, although these provide signals repeatedly. This is expedient in particular when the wake-up electrode is arranged on a less accessible monitoring zone, which monitors for example a zone beneath the bumper of a vehicle. Thus, the energy saving by the wake-up electrode is ensured even busy environments, e.g. in a multi-storey car park with frequent passers-by, because it is not triggered by these pedestrians, even if they pass through the detection zone of the other electrodes.

A particularly preferred configuration of the invention uses the control- and evaluation device to reduce the cycle rate of the control of the secondary electrodes for the case where the evaluation of a primary sensor electrode (wake-up electrode) indicates no actuation for a predetermined period of time.

Instead of making the reduction of the cycle rates of electrodes dependent on the fact that all, or the electrodes concerned, do not provide a detection, the detection of the wake-up electrode is delivered to a simple time monitoring. If no significant signal changes are detected for a predetermined period of time (a few hours), the detection frequency of the other electrodes is reduced. This time monitoring can also take place in multiple stages, after one or more days without detection, e.g. the cycle time of the other electrodes can be further reduced. Also the cycle time of the wake-up electrode can be set to a lower value e.g. after a predetermined period of time. In addition, in every configuration of the invention, the change into the energy-reduced mode can be made dependent on further vehicle parameters, e.g. the vehicle locking.

In a configuration of the invention, the alerting sensor electrode is arranged at a smaller distance from a monitored detection zone than the secondary (cycle-reduced) sensor electrodes.

In this configuration, at the forefront is the fact that at all times a reliable detection is possible, without, if applicable, a double actuation being necessary for the activation of all the electrodes (see above). This alternative has less potential for savings, because an erroneous triggering of the wake-up electrode through the far-reaching detection zone occurs more frequently than in the case of an electrode with a less accessible detection zone. This configuration can, however, also be available as an alternative mode to the above-mentioned mode via a setting in the on-board system.

The method according to the invention for detecting the approach and movement gestures of a user at a motor vehicle uses a capacitive sensor array of the above-mentioned type and at least one control device coupled with the sensor array. As part of the sensor array, at least two sensor electrodes are arranged at different positions of the vehicle. The changes in the capacitance of the sensor array are monitored with respect to a reference potential. By cyclical activation and interrogation of a first sensor electrode with a first cycle rate, the first sensor electrode is charged and discharged and a current- or voltage characteristic is received. The latter is evaluated for the detection of the capacitance change of the first sensor electrode.

If the evaluation does not produce any significant signal response (i.e. one which can indicate an operation by a user), a check is made as to which period of time has already elapsed without detection at the first electrode. For the case where no significant signal response was obtained for a predetermined minimum period of time (time period Mt), the cycle rate for activation of further sensor electrodes of the sensor array is decreased to a reduced cycle rate.

If, however, a significant signal response was obtained, the cycle rate for activation of such further sensor electrodes of the sensor array is increased, which are previously activated with reduced cycle rate.

Advantageous and/or preferred embodiments are characterized in the subclaims.

The invention is now explained in further detail with the aid of the attached figures.

FIG. 2 shows a diagrammatic presentation of a signal sequence of two sensor electrodes;

Figure 1A:
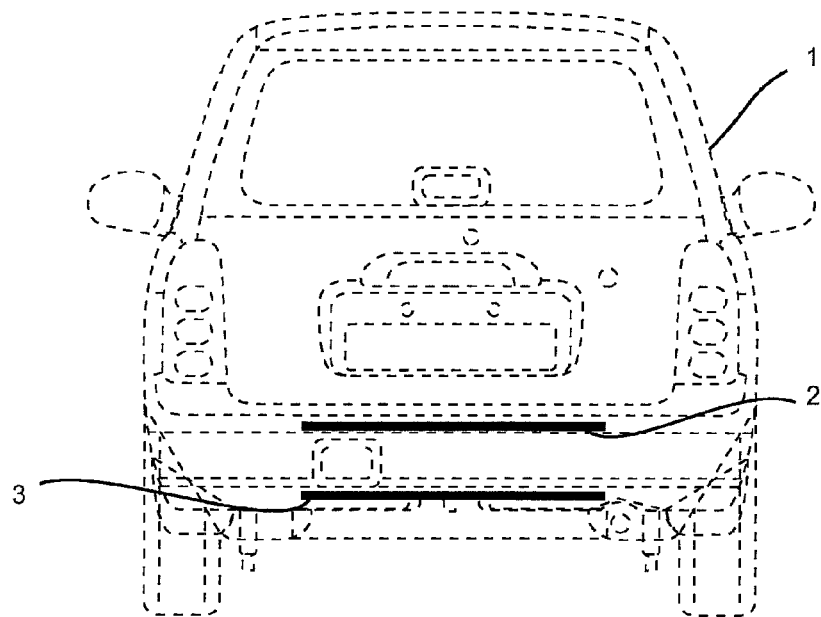
FIG. 1a shows the arrangement of a first embodiment of the sensor array according to the invention on a motor vehicle.
Figure 1B:
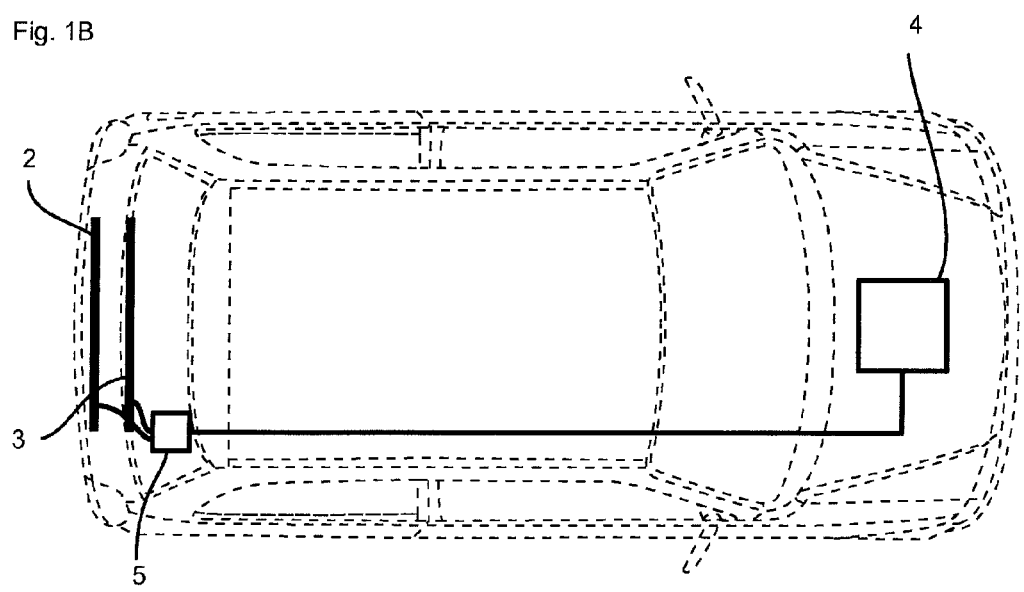
FIG. 1b shows the arrangement of FIG. 1 in a diagrammatic top view.

In FIG. 1a the rear of a vehicle 1 is shown. A sensor electrode array 2 is arranged in the region of the rear bumper. Beneath the sensor electrode array 2 (i.e. at a small height from the ground) a further sensor electrode 3 is arranged. The sensor electrodes 2 and 3 are connected respectively with a control- and evaluation device 5 (see FIG. 1B). The latter is coupled, in turn, with a central vehicle control unit 4, which controls and releases an opening of the tailgate of the vehicle. The electrodes are charged via the device 5 and the capacitance change of the electrodes, on the approach of a body, e.g. of a body part of the operator, can be detected by charge evaluation. This principle of a capacitive sensor is known in the field of motor vehicle technology.

The sensor electrode array 3 runs substantially parallel to the electrode 2. The electrodes 2 and 3 are constructed here continuously with substantially constant sensitivity. One or both of the electrodes could, however, also be constructed as segmented electrodes, the detection sensitivity of which varies in longitudinal direction, i.e. has regions with varying detection sensitivity in the direction of the extent of the bumper.

When wishing to carry out an operation, an operator can move his lower leg in a swinging movement under the bumper. This movement and approach is detected both by the electrode array 2 and also by the sensor electrode 3, as the capacitance change is interrogated repeatedly chronologically, and the change is evaluated. A capacitance is determined by each of the electrodes by repeated interrogation. In this example, the frequency of the interrogation can be 30 Hz initially for all electrodes. In each of the electrodes, however, the operation will bring about signal responses which are different chronologically and with regard to amount.

A time sequence of capacitance values, which the evaluation device 5 collects, is evaluated for the detection of characteristic features of an operating gesture. When both the signal sequences of the electrode 2 and also those of the electrode 3 show the characteristic values, a signalling takes place to the control unit 4. The latter registers the operating gesture and initiates an interrogation of an authorisation. In the course of this, ID transmitters, which an authorized user carries on his person, are interrogated in the environment of the vehicle. If such an ID transmitter with access authorization is detected and successfully interrogated, the opening of the boot lid is initiated.

If, however, the vehicle is locked and in addition no signal response which indicates an operation of this electrode 3 has been registered for a lengthy period of time, in this example for more than six hours, the control- and evaluation device 5 changes into a first energy-saving mode. In this first mode, the electrode 3 is still interrogated with 30 HZ, however the electrode 2 is only interrogated with 5 Hz. This reduced frequency reduces the necessary energy supply into this electrode and nevertheless ensures that the control- and evaluation device 5 receives five values per second from this electrode. On the basis of these values, a continuously updated calibration of this electrode can take place. If, for example, a rainfall begins around the parked car, the capacitance values of the electrodes will change, but so slowly that a calibration can be updated without any problems. The calibration takes place e.g. by the formation of a sliding mean value over the last 25 detected values (5 seconds). This mean value can be subtracted as offset from the current measurement values.

If no operation is detected at the electrode 3 for a further considerable longer time, e.g. three days (and the vehicle is also not unlocked by other access possibilities, e.g. via the vehicle doors), the detection frequency both of the electrode 3 and also of the electrode 2 can be further reduced. For example, the interrogation frequency for the electrode 3 is reduced to 10 Hz and the frequency of the electrode 2 remains at 5 Hz. In this case, however, in the case of an operation without prior notification to the vehicle (e.g. via ID transmitter), it can be necessary that an operating gesture has to be carried out several times, because firstly the electrode array has to be alerted. Nevertheless, the electrodes are in a calibrated state at all times, even when the detection cycle time is reduced.

Figure 1C:
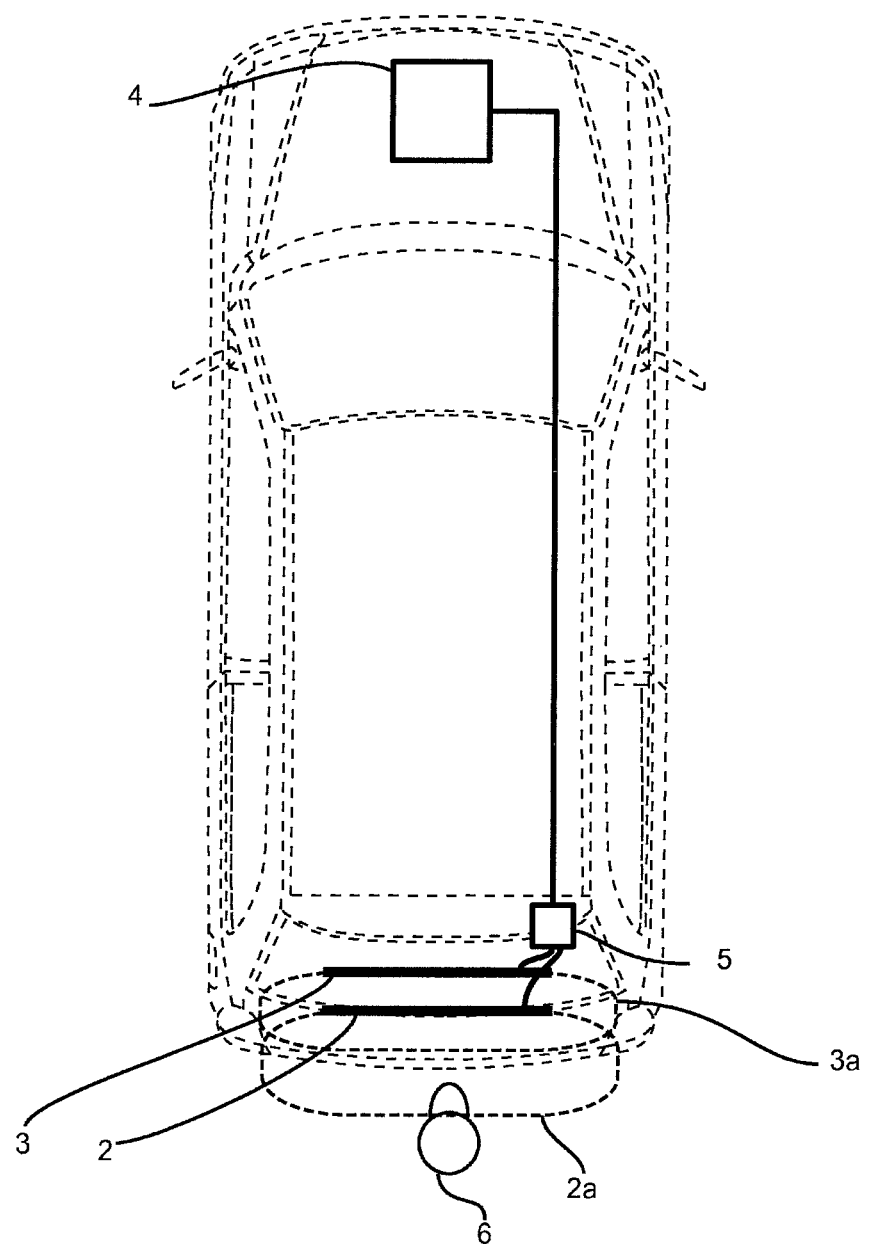
FIG. 1c shows the arrangement from FIGS. 1a and 1b in a diagrammatic top view with illustrated detection zones.

FIG. 1C shows the arrangement from another view. Here, the detection area 3a of the electrode 3 and the detection area 2a of the electrode 2 are illustrated. The lower leg 6 of an operator is shown symbolically. From this illustration, it can be seen that the operator is already situated in the detection area 2a, but not in the detection area 3a. If the operator 6 were a passer-by, this approach would not yet lead to an alerting of the sensor electrodes, because in this example the electrode 3 is constructed as wake-up or trigger electrode, as its accidental or undirected triggering is less likely than in the case of electrode 2. Which electrode is to act, however, as high clocked trigger electrode can be established by determining various interrogation modes in the on-board system, depending on whether maximum energy saving or maximum detection readiness is desired. If the electrode 2 is selected as wake-up electrode, then this indicated approach will lead to an alerting of all sensor electrodes, wherein the electrodes, which are calibrated at all times, are immediately detection-ready.

FIG. 2 shows an abstracted possible signal sequence for a sensor array with two sensor electrodes. The signal strengths or capacitances are represented along a time axis t.

The signals of the electrode 3 are represented in the background (lighter hatching), whereas the signals of the electrode 2 are shown in the foreground (stronger hatching).

Firstly, both electrodes are interrogated with the same frequency. At the time t1 a waiting time Mt after locking the vehicle has elapsed, and the interrogation frequency of the electrode 2 is reduced to a third with respect to the frequency of the electrode 3. The energy consumption of the system is thereby reduced.

At t2, the environmental conditions of the array change, e.g. it begins to rain. The offset values for both electrodes increase, taken into consideration, however, by a continuous calibration at both electrodes. Since also the electrode 2, even though with lower frequency, is interrogated, the calibration is included and the offset is updated at all times for a detection of an actuation. The sliding averages, which are calculated at all times for both electrodes, are represented by way of example.

It can be seen that at t3 in the electrode 2 a significant signal change occurs. As this electrode, however, is not the wake-up electrode and no significant change is detected at electrode 3, the electrode 3 remains in the cycle-reduced mode. This procedure can be brought about e.g. by a pedestrian who moves past the vehicle.

At time t4, the electrode 3 shows a significant change, which could indicate an actuation. The cycle time of the interrogation of electrode 2 is immediately increased, in order to be able to detect an actuation. With a successful interrogation, the opening of boot is activated by the central control device.

The invention claimed is:

1. A sensor arrangement for detecting the approach and movement gestures of a user at a motor vehicle, said sensor arrangement comprising:
   a capacitive sensor array and at least one control and evaluation device that is coupled to the sensor array and detects a change in the capacitance of the sensor array,
   wherein the sensor array comprises at least two sensor electrodes, which are arranged at spatially offset positions on the motor vehicle, the sensor electrodes being configured as elongate electrodes and being arranged with the same spatial orientation,
   wherein the control and evaluation device is designed for cyclical activation of the sensor electrodes in predetermined time intervals and to detect a change in the capacitance of each of the sensor electrodes,
   wherein the control and evaluation device is designed for the activation and evaluation of the sensor electrodes with changeable, electrode-specifically different cycle rates,
   wherein the control and evaluation device changes the cycle rate of the control and evaluation of individual electrodes as a function of the results of the evaluation at other electrodes.

2. The sensor arrangement according to claim 1, wherein one of the electrodes is able to be activated and evaluated by the control and evaluation device as a primary sensor electrode with a first cycle rate, and at least one secondary electrode is able to be activated as a function of the evaluation of the signals of the primary sensor electrode with a lower second cycle rate.

3. The sensor arrangement according to claim 2, wherein the control and evaluation device is designed for the reduction of the cycle rate of the activation of the secondary electrodes for the case where the evaluation of the primary sensor electrode indicates no actuation for a predetermined period of time.

4. The sensor arrangement according to claim 2, wherein the primary sensor electrode is arranged at a smaller distance from a monitored detection zone than the secondary sensor electrodes.

5. The sensor arrangement according to claim 1, wherein at least one of the sensor electrodes is arranged in a bumper of a motor vehicle.

* * * * *